United States Patent [19]
Botez et al.

[11] Patent Number: 5,606,570
[45] Date of Patent: Feb. 25, 1997

[54] HIGH POWER ANTIGUIDED SEMICONDUCTOR LASER WITH INTERELEMENT LOSS

[75] Inventors: Dan Botez, Madison, Wis.; Charles A. Zmudzinski, Redondo Beach, Calif.; Luke J. Mawst, Sun Prairie, Wis.

[73] Assignee: Wisconsin Alumni Research Foundation, Madison, Wis.

[21] Appl. No.: 435,598

[22] Filed: May 8, 1995

[51] Int. Cl.$^6$ ................................................ H01S 3/19
[52] U.S. Cl. ........................................ 372/50; 372/18
[58] Field of Search ..................................... 372/50, 18

[56] References Cited

U.S. PATENT DOCUMENTS

| 4,860,298 | 8/1989 | Botez et al. | 372/50 |
| 4,985,897 | 1/1991 | Botez et al. | 372/50 |
| 5,101,413 | 3/1992 | Botez | 372/50 |
| 5,159,604 | 10/1992 | Mehuys et al. | 372/50 |
| 5,272,711 | 12/1993 | Mawst et al. | 372/45 |

OTHER PUBLICATIONS

Botez, D. et al. "Resonant optical transmission and coupling of phase-locked diode laser arrays of antiguides . . . " Appl. Phys. Lett. 54(22), May 29, 1989 pp. 2183–2185.
Botez, D. et al. "Diffraction-Limited In-Phase-Mode Operation From Uniform Array of Antiguides . . . " Elec. Lett. 25(19), Sep. 14, 1989, pp. 1282–1283.
CLEO/IQEC '94 Advance Program, p. 52, Abstract entitled "Uniform near-field flat-phase-front antiguided power amplifier with a three-core ARROW master oscillator," distributed prior to May 8, 1994.
C. A. Zmudzinski, et al., "Uniform near-field, flat-phase-front antiguided power amplifier with Three-core ARROW master oscillator," CLEO '94, 1994 Technical Digest Series, Conference Edition, vol. 8, May 8–13, 1994.
Dan Botez, et al., "Phase-Locked Arrays of Antiguides: Analytical Theory II," IEEE Journal Quantum Electronics, vol. 31, No. 2, Feb. 1995, pp. 244–253.

Lew Golberg, et al., "Filament Formation in a Tapered GaAIAs Optical Amplifier," Appl. Phys. Lett., vol. 62, No. 19, 10 May 1993, pp. 2304–2306.
D. Mehuys, et al., "5.25–W CW Near–Diffraction–Limited Tapered–Stripe Semiconductor Optical Amplifier," IEEE Photonics Technology Letters, vol. 5, No. 10, Oct. 1993, pp. 1179–1182.
D. Botez, et al., "Flat–Phasefront Fanout–Type Power Amplifier Employing Resonant–Optical–Waveguide Structures," Appl. Phys. Lett., vol. 63, No. 23, 6 Dec. 1993, pp. 3113–3115.
Dan Botez, et al., "Phase–Locked Arrays of Antiguides: Modal Content and Discrimination," IEEE J. of Quantum Electronics, vol. 26, No. 3, Mar. 1990, pp. 482–495.
L. J. Mawst, et al., "Design Optimization of ARROW–Type Diode Lasers," IEEE Photonics Technology Letters, vol. 4, No. 11, Nov. 1992, pp. 1204–1206.
Joseph H. Abeles, et al, "Finite Difference Beam Propagation Method Modeling for High Power Semiconductor Fanned–Out Amplifer Lasers," Conference Digest of the OSA Optical Design for Photonics Conference, Paper No. PD2, Palm Springs, California 1993. (no month available).
Sujatha Ramanujan, et al., "Temporal Behavior of Resonant–Optical–Waveguide Phase–Locked Diode Laser Arrays," Appl. Phys. Lett., vol. 64, No. 7, 14 Feb. 1994, pp. 827–829.
C. Zmudzinski, et al., "Three–Core ARROW–Type Diode Laser: Novel High–Power, Single–Mode Device, and Effective Master Oscillator to Flared Antiguided MOPAs," Technical Digest CLEO–Europe Conference, Paper CTuP3 Amsterdam, Netherlands, Aug.–Sep. 1994, pp. 169–170.
L. J. Mawst, et al., "Above–Threshold Behavior of High––Power, Single–Mode Antiresonant Reflecting Optical Waveguide Diode Lasers," Appl. Phys. Lett., vol. 66, No. 1, 2 Jan. 1995, pp. 7–9.

Primary Examiner—Rodney B. Bovernick
Assistant Examiner—Yisun Song
Attorney, Agent, or Firm—Foley & Lardner

[57] ABSTRACT

A semiconductor laser is formed with an array of a small number (two to ten) antiguide elements each containing a portion of the active region of the semiconductor laser. Interelement structures between the antiguide elements are formed to have a relatively high interelement loss coefficient (at least 100 cm$^{-1}$), providing excellent discrimination between the resonant in-phase mode and the unwanted nonresonant modes. Lateral reflectors may be utilized at the edge of the array to reflect light back to the array, but are not necessary when the antiguide elements are sufficiently wide and the effective index step between the antiguide elements and interelement structures is sufficiently large. Because only a relatively small number (10 or less) of antiguide elements are utilized, fabrication tolerances are relatively large and practical devices may be produced with satisfactory yields. The semiconductor laser of the invention may be utilized as a master oscillator integrated with flared antiguided master-oscillator power-amplifiers (MOPA) to provide uniform MOPA near-field intensity profiles at high power levels.

37 Claims, 14 Drawing Sheets

HIGH POWER ANTIGUIDED SEMICONDUCTOR LASER WITH INTERELEMENT LOSS

FIELD OF THE INVENTION

This invention pertains generally to the field of semiconductor diode lasers and particularly to antiguided diode laser arrays.

BACKGROUND OF THE INVENTION

Semiconductor diode lasers are formed of multiple layers of semiconductor materials. The typical semiconductor laser diode includes an n type layer, a p type layer, and an undoped active layer between them such that when the diode is forward biased electrons and holes recombine in the active layer with the resulting emission of light. The layers adjacent to the active layer typically have a lower index of refraction than the active layer and form cladding layers that confine the emitted light to the active layer and sometimes adjacent layers. Crystal facets are typically located at opposite edges of the multilayer structure to provide reflection of the emitted light back and forth in a longitudinal direction, generally in the plane of the layers, to provide lasing action and emission of laser light from one of the facets.

To confine the emitted light laterally, positive-index guides or negative-index guides (antiguiding) structures may be employed in a laser diode array. In a positive-index guide, the refractive index is highest in regions where the laser light has field-intensity peaks and is lower in regions of low field intensity, effectively trapping light within the high-index regions, i.e., the laser elements. In negative-index guiding or antiguiding, the refractive index is lowest in regions where the laser light has maximum field intensity, i.e., the array elements, and is highest in regions that contain relatively low field intensity. Consequently, some of the emitted light will pass into the higher refractive index interelement regions and thus will not be confined to the lasing element regions.

An array of laser emitters can typically oscillate in several possible modes. In a fundamental or zero phase shift array mode, the emitters oscillate in phase, and a far field pattern is produced in which most of the energy is concentrated in a single lobe which is ideally diffraction limited. In general, there are many possible array modes for a multiple element array, and many laser arrays operate in two or three array modes simultaneously and produce one or more beams that are typically two or three times wider than the diffraction limit.

The problems associated with the operation of laser arrays at high power with high beam quality are discussed in U.S. Pat. No. 4,985,897, entitled Semiconductor Laser Array Having High Power and High Beam Quality. That patent describes a laser diode structure, which may be implemented in an antiguided structure, operated at or near a resonance condition in which coupling occurs between all elements of the array.

The development of high-power (greater than one watt) coherent diode laser sources has been an area of continued research efforts. Positive index-guided single-element devices have demonstrated up to 0.6 watt (W) continuous wave (CW) coherent power, with reliable operation demonstrated to only 0.2 W, primarily being limited by the relatively small waveguide width of ≈3 µm. Single-element antiresonant reflecting optical waveguide (ARROW) lasers have also demonstrated single-mode optical power up to ≈0.5 W, with the added benefit of a drive-independent beam pattern, due to strong lateral optical-mode confinement in devices of 4–6 µm aperture width. See L. J. Mawst, D. Botez, C. Zmudzinski, and C. Tu, "Design optimization of ARROW-type diode lasers," IEEE Photon. Technol. Lett., Vol. 4, pp. 1204–1206, November 1992. In fact, single-mode ARROW devices with aperture width of up to 10 µm are possible, which should allow for reliable powers of ≈0.5 W from devices with nonabsorbing mirrors.

Research on phase-locked diode laser arrays in an attempt to increase the aperture width and operating power met with little success in controlling the complicated mode structure until the development of resonant-optical-waveguide (ROW) antiguided arrays. Such arrays are described in D. Botez, L. J. Mawst, G. L. Peterson, and T. J. Roth, "Phase-locked arrays of antiguides: Modal content and discrimination," IEEE J. Quantum Electron., Vol 26, pp. 482–495, March 1990. Antiguided arrays have demonstrated near-diffraction-limited CW operation at 1 W from a 120 µm aperture, with up to 0.6 W in the central lobe of the far-field emission pattern, and reliable operation over 3500 hours has been achieved at 0.5 W CW output, thus making ROW arrays the only high-power coherent device type to date that has demonstrated long-term reliability. However, since such devices are based on meeting a (lateral) optical resonance condition, the fabrication tolerances on their structural parameters have been experimentally and theoretically determined to be very tight, especially as the number of elements increases. See D. Botez, A. Napartovich, and C. Zmudzinski, "Phase-locked arrays of antiguides: Analytical theory II," IEEE J Quantum Electron., Vol. 31, pp. 244–253, February 1995.

Higher, single-mode powers (2–3 W CW) have been demonstrated from "broad-area" type tapered master oscillator power amplifiers (MOPAs), which are in commercial production. However, by their very nature, these "broad area" devices are inherently sensitive to carrier- and thermal-induced index variations that degrade the quality of the beam, and cause the phase correction via external lenses to be drive dependent. See D. Mehuys, L. Goldberg, and D. F. Welch, "5.25-W CW near-diffraction-limited tapered-stripe semiconductor optical amplifier," IEEE Photon. Technol. Lett., Vol. 5, pp. 1179–1182, October 1993, In addition, they have a tendency to break into filaments if the linewidth enhancement factor, α, is greater than two, and/or if non-uniformities are present. J. H. Abeles, R. Amantea, R. Rios, and D. J. Channin, "Finite Difference Beam Propagation Method Modeling for High Power Fanned-Out Amplifier Lasers," Conference Digest of the OSA Optical Design for Photonics Conference, Paper No. PD2, Palm Springs, Calif. 1993; L. Goldberg, M. Surette and D. Mehuys, "Filament formation in tapered GaAlAs optical amplifiers," Appl Phys. Lett , Vol 62, pp 2304–2306, May 1993. For these reasons, reliability remains a question for tapered "broad area" devices.

SUMMARY OF THE INVENTION

The semiconductor laser of the present invention has an index-antiguided structure which provides for coherent, high power, reliable operation. This laser structure is obtained with a relatively small number of antiguided laser core elements (two to ten). The small number of antiguide elements allows relatively large fabrication tolerances with the excellent intermodal-discrimination properties of small element number antiguided arrays. Thus, the device of the present invention may be readily fabricated and avoids the tight fabrication tolerances, and consequent lower yields, of prior resonant optical-waveguide (ROW) arrays which require very tight fabrication tolerances.

To obtain single-spatial-mode selectivity, it has been determined, in accordance with the present invention, that interelement loss may be chosen to provide the desired spatial mode. For sufficiently large effective refractive index steps between the antiguided core elements and the interelement structures between the core elements, and relatively large width antiguided elements, the losses at the edges of the array for the desired fundamental mode are sufficiently small (e.g., less than 10 cm$^{-1}$) as to have negligible effect on the efficiency of the device. If desired, edge reflectors may be incorporated at the edges of the array to reflect emitted light back to the array. Due to the strong index guiding, the structures are virtually immune to gain spatial hole burning. The central lobe energy content is found to be in the range of 65% to 75% and the emitting aperture may be formed in the range of 25 µm or more, which allows 1 W CW reliable single mode power from devices with oxide-free facets.

The antiguided laser of the present invention may be utilized as an integrated master oscillator for flared antiguided master-oscillator power amplifiers (MOPA), to provide uniform MOPA near-field intensity profiles. Such structures enable high power (e.g., 3–5 W) CW diffraction-limited power to be achieved from a stable flared MOPA.

Further objects, features and advantages of the invention will be apparent from the following detailed description when taken in conjunction with the accompanying drawings.

DETAILED DESCRIPTION OF THE INVENTION

Figure 1:
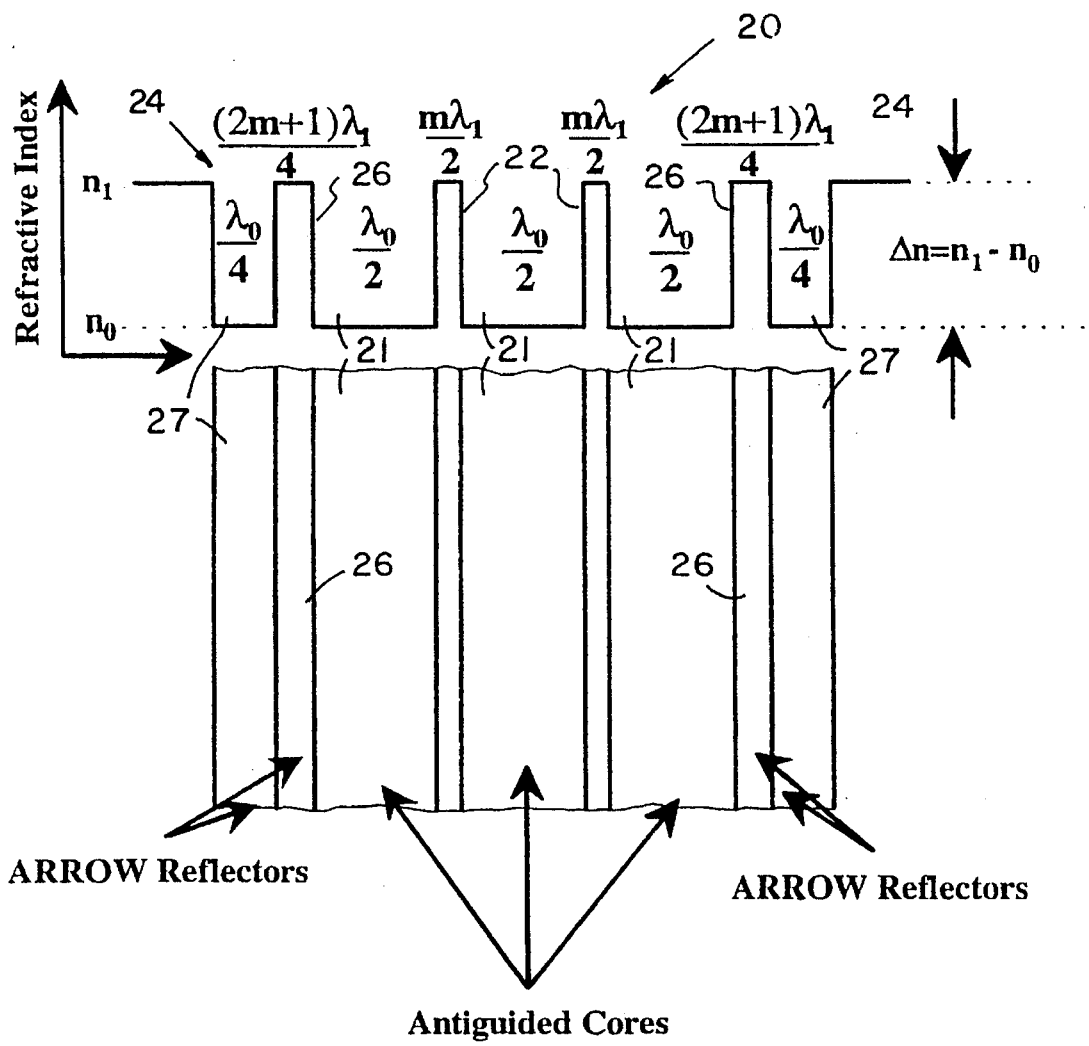
FIG. 1 is a schematic representation of a three-core ARROW type laser structure.

The present invention incorporates an index-antiguided structure for laser diodes which achieves high coherent power (in the range of 1 W) and reliable operation. The laser of the present invention combines the characteristics of ROW arrays and ARROW lasers. The strong built-in index step of these devices makes them immune to gain spatial hole burning and other carrier- and thermal-induced index variations that degrade performance and reliability of broad area devices. Furthermore, the relatively small number of antiguide elements significantly reduces the required fabrication tolerances. In addition, the device is not limited to relatively small emitting apertures of single element ARROW devices (which are typically in the range of 4–6 µm).

To illustrate the principles of the invention, a three-core ARROW device embodying the invention is described below, although it is understood that the present invention may utilize numbers of antiguide elements in the range of 2 to 10. A three-core ARROW laser structure 20 in accordance with the invention is schematically shown in simplified side and top views of regions of effective refractive index in FIG. 1. The semiconductor laser 20 has a resonant antiguided array of three antiguide core elements 21, interelement structures 22 between the antiguide elements 21, and quarter-wave-type stack reflectors 24 at both edges of the array. Not shown in FIG. 1 for simplification are the active light emitting layer and other semiconductor layers, which are discussed in more detail below. The construction of such semiconductor laser structures is described in U.S. Pat. No. 4,985,897, incorporated herein by reference. The parameter m shown in FIG. 1 determines the number of interelement field-intensity peaks for resonant or near-resonant modes. In-phase modes correspond to odd m values, while out-of-phase modes correspond to even m values. At resonance, the width d of the antiguided cores is $d=\lambda_0/2$, where $\lambda_0$ is the laterally projected wavelength in the antiguided cores 21, and the width s of the high-index interelement structures 22 separating the antiguided cores is $s=m\lambda_1/2$, where $\lambda_1$ is the laterally projected wavelength in the interelement structures 22. For array modes composed of coupled fundamental (element) modes, at resonance, d, s, $n_0$, and $n_1$ are related according to the dispersion relation given by:

$$n_1^2 - n_0^2 = \left(\frac{m\lambda}{2s}\right)^2 - \left(\frac{\lambda}{2d}\right)^2 \quad (1)$$

where $\lambda$ is the free space wavelength, $n_0$ is the effective refractive index of the antiguide elements 21, and $n_1$ is the effective refractive index of the interelement structures 22. That is, for a given geometry (s, d, and m), the desired mode will be resonant if $n_1$ and $n_0$ satisfy this dispersion relation. The index step is $\Delta n = n_1 - n_0$. In practice, $d \gg s$ and $n_1 \approx n_0$ so that the index step at resonance ($\Delta n_{res} = n_1 - n_0$) can be approximated as $$\Delta n_{res} \approx \frac{1}{8n}\left(\frac{m\lambda}{s}\right)^2 \quad (2)$$

where n is either $n_0$ or $n_1$.

The width of the inner, high-index section 26 of the "quarter-wave" ARROW reflector 24 corresponds to three "lateral" quarter-waves (when m=1) to insure that the field in the (low-index) outer section 27 of the "quarter-wave" stack 24 is in phase with the field in the antiguide element(s) 21. The width of the outer, low-index section 27 of the ARROW reflector 24 corresponds to one "lateral" quarter wave ($\lambda_0/4$).

Figure 2:
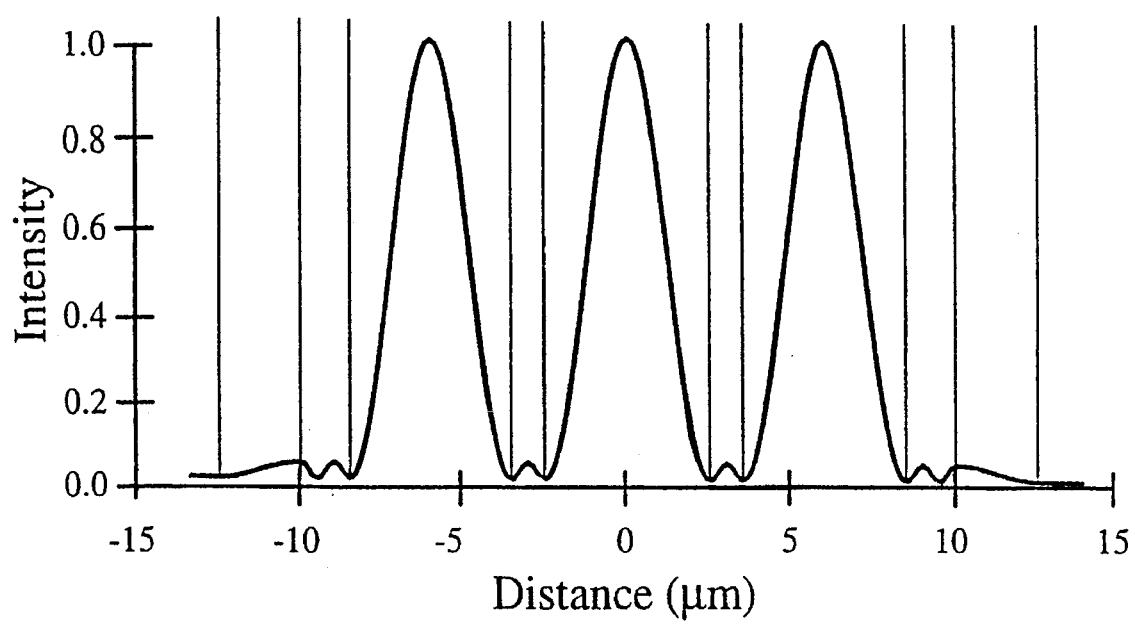
FIG. 2 is a graph showing the near-field intensity profile for the fundamental, in-phase mode of a three core ARROW device as in FIG. 1 with m=1, $n_0$=3.40, $n_1$=3.425, $\lambda_1$=2 µm, $\lambda_0$=10 µm.
Figure 3A:
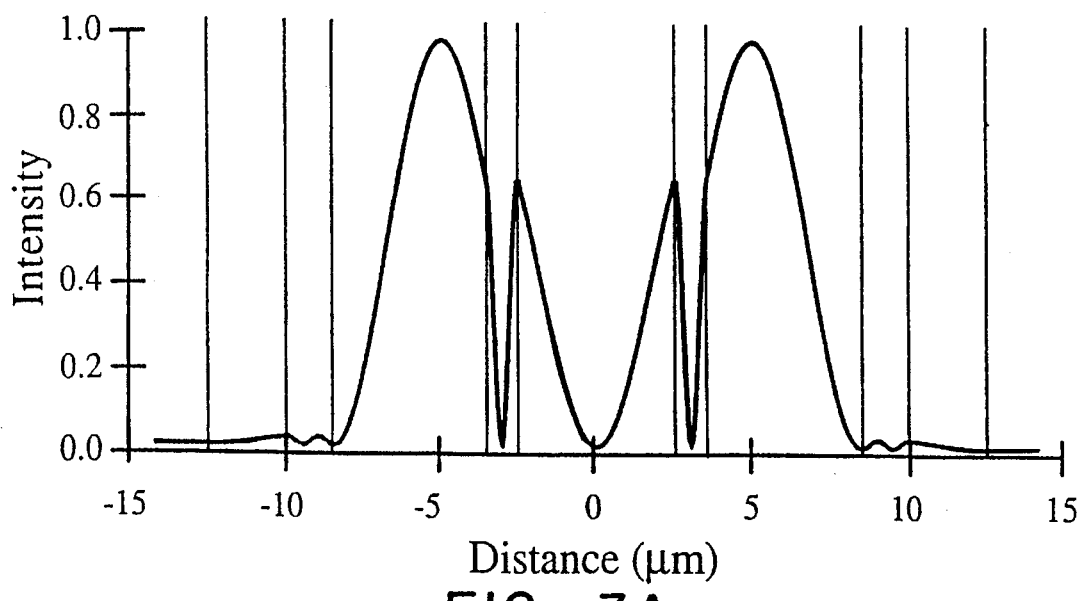
FIG. 3A is a graph showing the near-field intensity profile for the lower adjacent mode, mode 7, of the structure considered in FIG. 2.
Figure 3B:
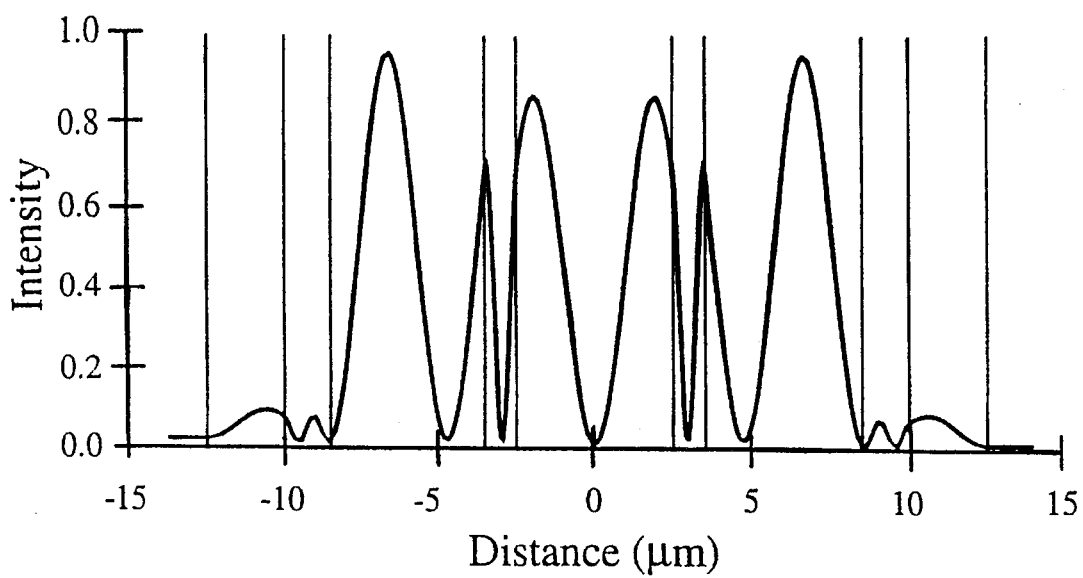
FIG. 3B is a graph showing the near-field intensity profile for mode 9, the upper adjacent mode, for the structure considered in FIG. 2.
Figure 4A:
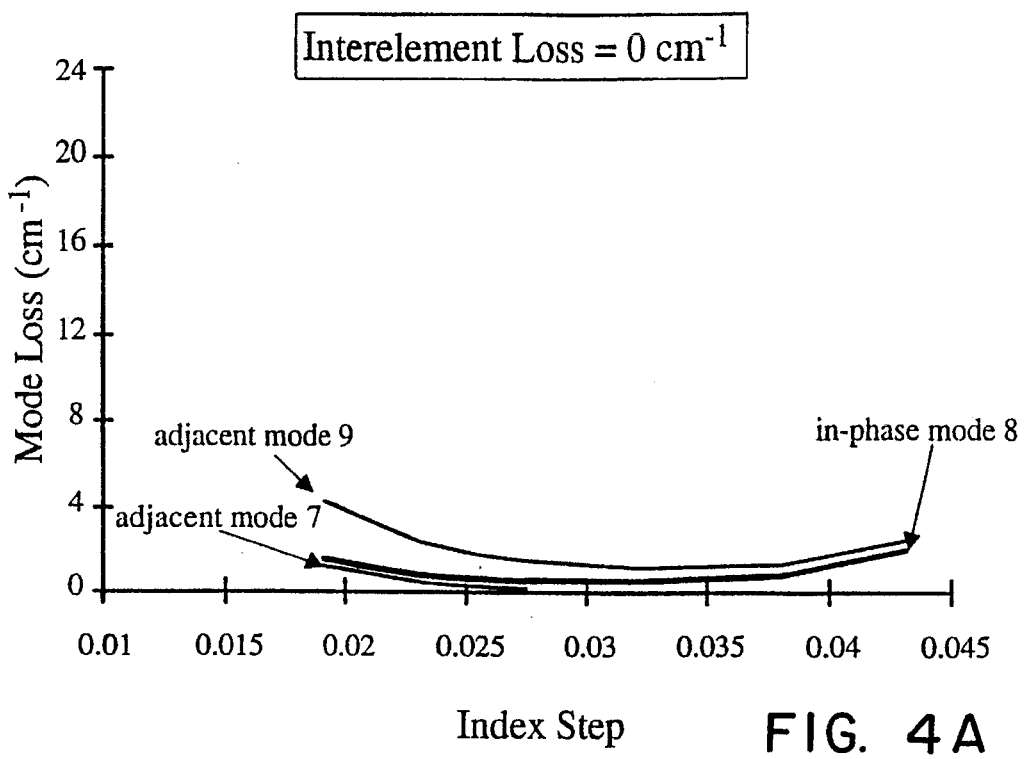
FIG. 4A are graphs showing mode losses versus index step Δn for the device shown in FIG. 2 when there is no interelement loss.

In single-core ARROW lasers, it has previously been demonstrated that ARROW-type reflectors selectively reduce the loss of the fundamental mode relative to the loss of the first-order mode. See L. J. Mawst, et al., November 1992, supra. In a similar manner, the ARROW reflectors 24 of the three-core ARROW laser 20 selectively reduce the edge radiation losses of fundamental, adjacent, and out-of-phase array modes composed of coupled fundamental (element) modes relative to array modes composed of coupled first-order (element) modes. For example, the edge radiation losses for the fundamental, adjacent, and out-of-phase array modes for a structure as shown in FIG. 1 with 5 μm wide elements 21, 1 μm-wide interelement structures 22, λ=0.85 μm, and m=1, are below 4 cm$^{-1}$ (as illustrated in FIG. 4A), while array modes composed of coupled first-order (element) modes have significant edge loss (about 60–70 cm$^{-1}$), and thus are effectively suppressed. Therefore, the ARROW reflectors 24 will improve the differential quantum efficiency of array modes, while providing strong discrimination against array modes composed of coupled first-order modes. However, the edge radiation losses, which may help discriminate between the fundamental array mode and the adjacent array modes, are suppressed as seen from a plot of mode loss versus index step (FIG. 4A) for relevant array modes (shown in FIGS. 2 and 3). That is, the increase in the quantum efficiency of the array mode comes at a heavy price in intermodal discrimination. An array with ARROW-type terminations will operate efficiently but multimode. Therefore, another intermodal discrimination mechanism is needed to suppress adjacent and out-of-phase array modes.

By examining the near-field radiation patterns of the fundamental, adjacent and out-of-phase modes, it is seen that interelement loss can be used to suppress effectively the adjacent and out-of-phase modes with negligible loss penalty on the fundamental mode. The desired fundamental or in-phase array mode, shown in FIG. 2, has 8 intensity nulls (for which reason it is called mode 8). When loss is placed in the interelement structures 22, nonresonant modes (such as 6, 7 and 9) are suppressed due to their relatively high interelement field compared to the resonant mode, as shown in FIG. 3A and 3B. This is especially true as the ratio of the antiguide element 21 width, d, to the interelement structure 22 width, s, becomes larger. It has been shown (D. Botez, et al., February 1995, supra) that the ratio of the excess mode loss of the adjacent modes to the excess mode loss of the desired fundamental mode, at resonance, defined as relative excess loss (REL), is given by:

$$REL = \frac{3m^2 d^3}{4s^2 \Lambda} \approx \frac{3}{4}\left(\frac{md}{s}\right)^2 \quad (3)$$

where $\Lambda$ is the array period (i.e., $\Lambda = d + s$). Because the present invention utilizes structures of large d/s ratio, REL can be well approximated by (¾) (md/s)$^2$. Because intermodal discrimination increases with REL, structures with a large d/s ratio and an appropriate amount of interelement loss can effectively suppress adjacent modes with negligible penalty on the resonant mode. Furthermore, a large d/s ratio is desirable since the percentage of power in the central far-field lobe has been shown to also increase with increasing d/s, and temporal stability can be expected in spite of high interelement loss. See S. Ramanujan, H. G. Winful, M. Felisky, R. K. DeFreez, D. Botez, M. Jansen, and P. Wisseman, "Temporal behavior of resonant-optical-waveguide phase-locked diode laser arrays," Appl. Phys. Lett., Vol. 64, pp. 827–829, February 1994.

Figure 4B:
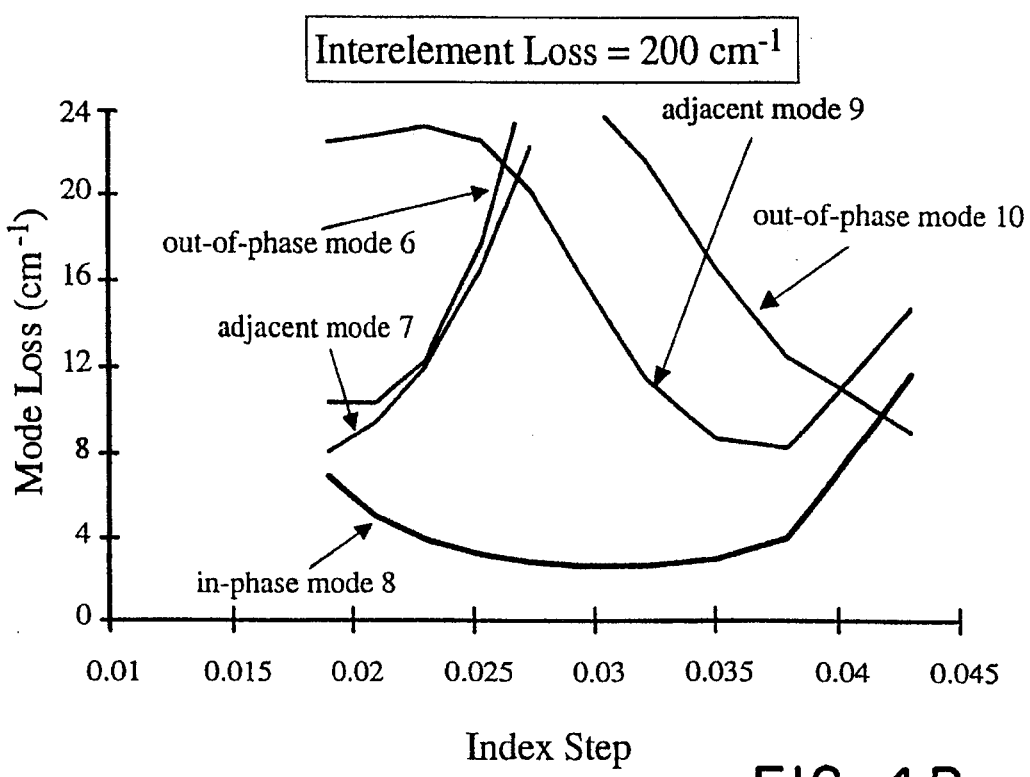
FIG. 4B are graphs showing mode losses versus index step Δn for the device shown in FIG. 2 when the interelement loss coefficient is 200 cm$^{-1}$, with resonance occuring for the in-phase mode at Δn=0.025.

As an example, FIG. 4B shows mode loss for the relevant modes of a structure with d=5 μm, s=1 μm, and interelement loss coefficient=200 cm$^{-1}$ (the effective loss in each of the interelement structures 22), as a function of index step, $\Delta n$. Mode 8, the in-phase mode, has a relatively low loss of 2.5–4 cm$^{-1}$ over a wide range in index-step variation. The nonresonant array modes are strongly affected, providing a maximum intermodal discrimination of 18 cm$^{-1}$ at $\Delta n = 2.7 \times 10^{-1}$. Such large intermodal discrimination values coupled with the fact that resonant and near resonant antiguided arrays have been shown to be self-stabilizing against gain spatial hole burning allows single-spatial-mode operation to very high powers. Further, intermodal discrimination of over 5 cm$^{-1}$ occurs for a relatively wide variation in $\Delta n$: from $2.1 \times 10^{-2}$ to $3.6 \times 10^{-2}$. This fact substantially relaxes fabrication tolerances in comparison to larger element arrays. The tremendous impact of interelement loss on the intermodal discrimination of antiguided arrays with ARROW terminations is self-evident by comparing FIG. 4A and FIG. 4B. Out-of-phase mode 6 is not shown in FIG. 4A since it has negligible loss: <0.2 cm$^{-1}$.

Figure 5:
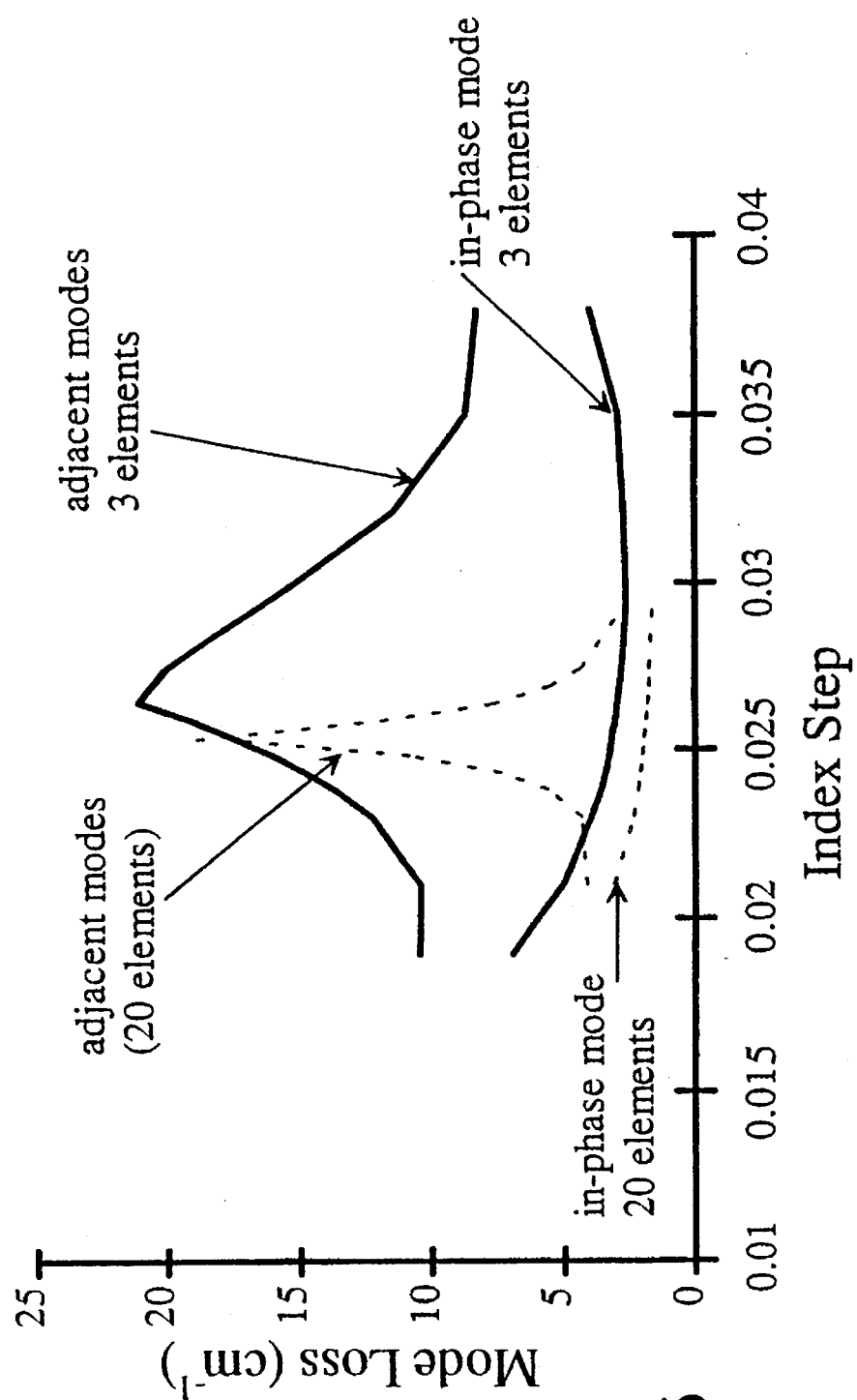
FIG. 5 are graphs showing a comparison between intermodal discrimination in the three core ARROW device of FIG. 2 and a representative 20-core ARROW device.

It is apparent from FIG. 4B that the peak of the curve that defines the maximum adjacent-mode loss (mode 7 on the low-$\Delta n$ side of resonance and mode 9 on the high-$\Delta n$ side), occurs close to resonance ($\Delta n_{res} \approx 2.5 \times 10^{-2}$). The region over which the array is "close" to resonance can be defined by the full width at half maximum (FWHM) of this peaked curve made of adjacent-mode loss versus $\Delta n$ curves. The FWHM of the discrimination plot is in turn related to the range in $\Delta n$ over which the effect of interelement loss on the adjacent mode plays a role in intermodal discrimination. This range in $\Delta n$ has been analytically shown to be proportional to 1/N, where N is the number of elements. Therefore, the fabrication tolerance in index step for a 3-core ARROW device should be a factor of about six (i.e., 20/3) times greater than for a 20-element array. FIG. 5 compares the mode losses for the fundamental and adjacent modes near resonance for a 20-core ARROW structure with d=5 μm, s=1 μm, and interelement loss coefficient=200 cm$^{-1}$, versus the three-core ARROW structure from FIG. 4B. As expected, the FWHM is about a factor of 5 greater for the three-core device as compared to the 20-core device. The increased fabrication tolerance is obtained at a cost in reduced aperture width. Nonetheless, ARROW structures with as few as three cores can provide 1 W CW diffraction-limited power.

Figure 6:
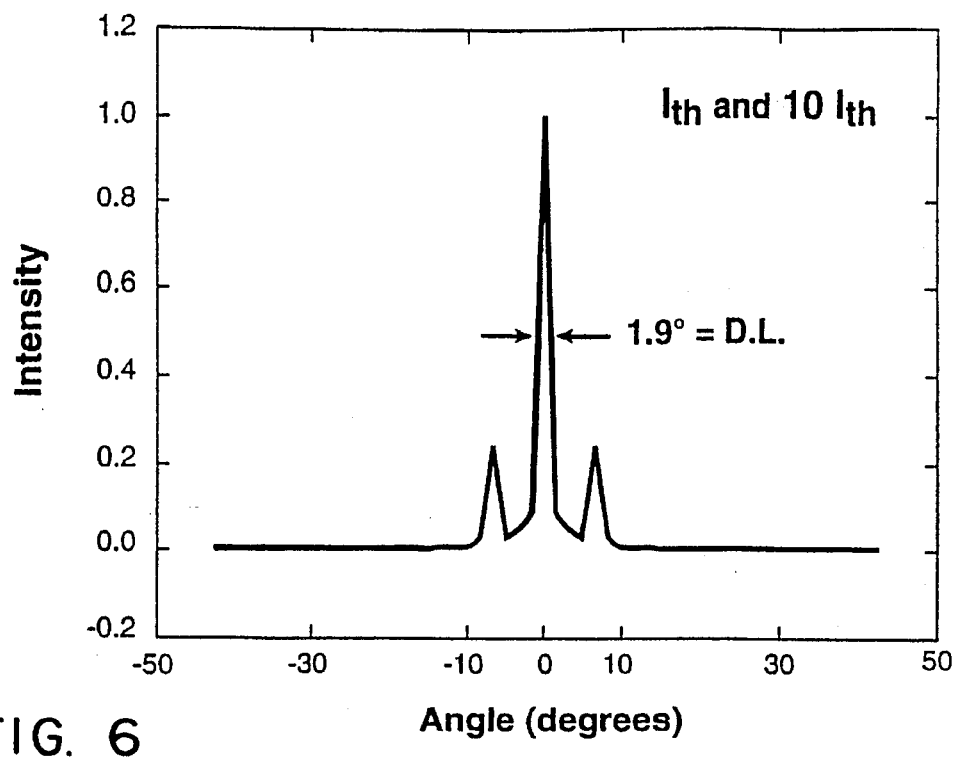
FIG. 6 is a graph showing the above-threshold analysis of a three core ARROW device as in FIG. 1 with an antiguide element width d of 6 µm, m=1 and interelement structure width, s, of 1 µm, illustrating the diffraction limited far-field pattern at threshold and at 10 times threshold.
Figure 7:
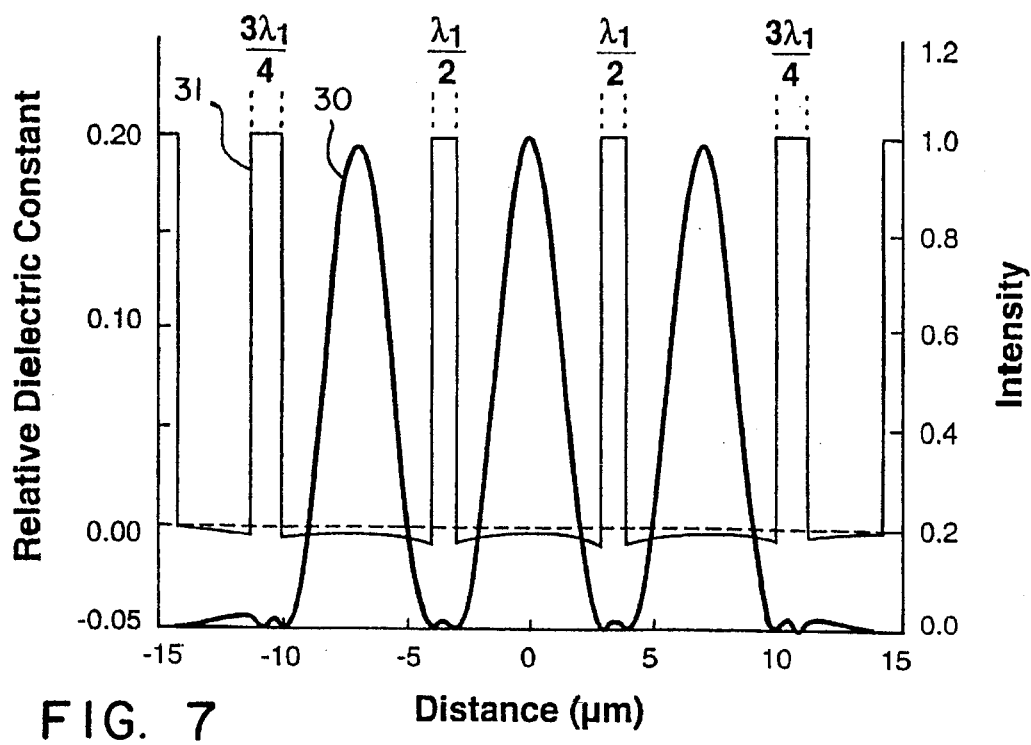
FIG. 7 are graphs of the device as in FIG. 6 illustrating the in-phase mode near-field profile and the relative dielectric constant at 10 times lasing threshold.

Above-threshold analysis of the three-core ARROW structure that includes the effects of gain spatial hole burning and carrier diffusion, indicates that diffraction-limited, stable, fundamental-mode operation occurs to at least 10 times threshold. FIG. 6 shows the diffraction limited far-field radiation patterns at 10 times threshold for a structure with d=6 μm and s=1 μm, and FIG. 7 shows the in-phase mode near-field profile (graph 30) and the relative dielectric constant (graph 31) at 10 times threshold. Stable, diffraction-limited-beam operation occurs up to 10 times threshold, with 67% of the power in the central lobe of the far-field pattern.

To optimize a multicore ARROW laser in accordance with the invention, the total aperture width, maximum discrimination, percentage of power in the central lobe, and tolerance in index step, should be considered. The element-to-interelement width ratio, d/s, should be as large as possible to increase the percentage of power in the central lobe, increase the aperture width, and increase the relative discrimination against adjacent modes using interelement loss (see Equation (3)). Above-threshold analysis of ARROW devices indicates that the maximum antiguide element width d allowed before gain spatial hole burning affects the beam pattern is about 10 μm. Such large values of d are possible because of the large built-in index step, Δn, of these lasers. Since the index step at resonance is proportional to m$^2$ (Equation 2), a factor of about 9 increase in Δn can be achieved by increasing m from 1 to 3, resulting in an index step as high as about 0.1 when m=3. Furthermore, a large index step value is desirable to further increase the in-phase-mode stability against gain spatial hole burning.

Figure 8:
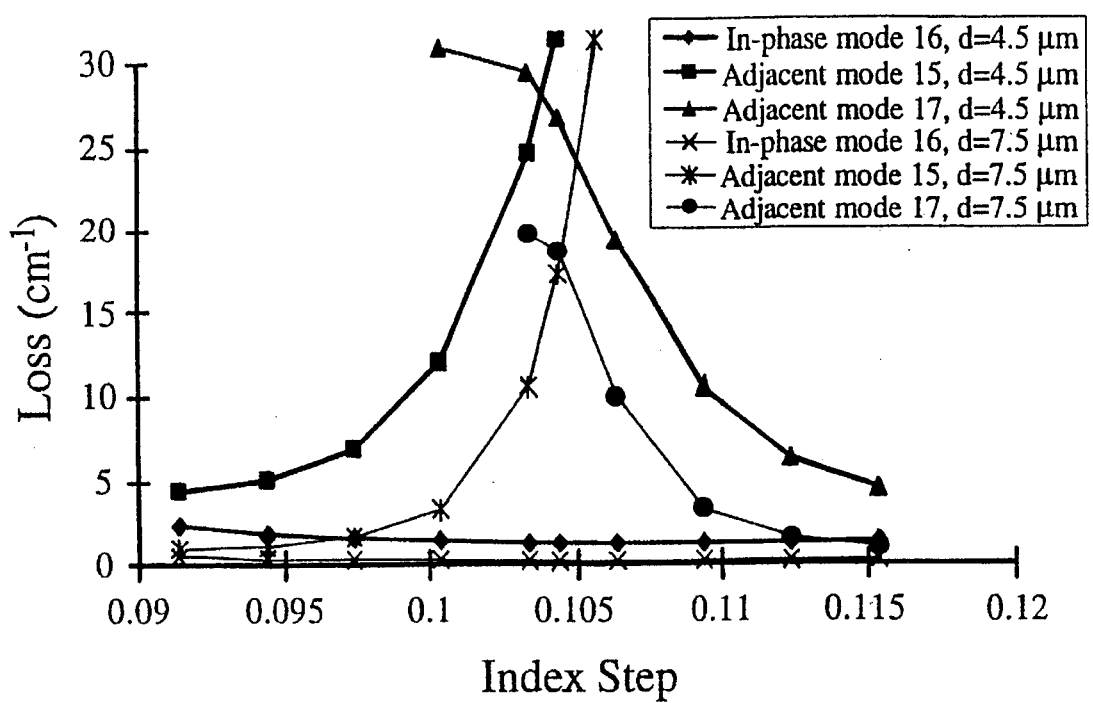
FIG. 8 are graphs showing mode losses versus index step, Δn, for 3-core ARROW devices with interelement structure width s=1.5 µm, interelement structure loss=200 cm$^{-1}$, m=3, and of various element width d; d=4.5 µm shown in heavy solid lines and d=7.5 µm in light solid lines, wherein in-phase-mode resonance occurs at Δn=0.104.

In general, as the index step increases, the maximum intermodal discrimination decreases, and as the element width d increases, the maximum intermodal discrimination and the tolerance in index step decreases. These trends are apparent from FIGS. 4A, 4B and 8. FIG. 8 shows the mode losses as a function of index step for two high-Δn (Δn=0.1) structures (d=4.5 μm and d=7.5 μm) with an interelement width s=1.5 μm, interelement loss coefficient of 200 cm$^{-1}$, and m=3.

FIG. 4B, and the case of d=7.5 μm in FIG. 8, may be compared since they represent structures of same d/s ratio (i.e., 5) and same interelement loss (i.e., 200 cm$^{-1}$). Since the relative amount of fundamental-mode interelement field, at resonance, is proportional to 1/m$^2$, the influence of interelement loss on the fundamental mode of the m=3 structure (FIG. 8) is negligible. Since the REL ratio as expressed in Equation 3 is proportional to m$^2$, the same amount of maximum intermodal discrimination (about 18 cm$^{-1}$) is obtained for both cases. However, the range in Δn over which significant discrimination (i.e., 5 cm$^{-1}$) occurs decreases substantially for the high-Δn case (0.07 for high Δn versus 0.15 in the low-Δn case). It is interesting to note that the FWHM of the peaked curve defined by the adjacent-mode losses is about three times less in the high-Δn case than in the low-Δn case. That is, the discrimination-curve FWHM appears to be proportional to 1/m. This trend is consistent with the fact that the range over which adjacent modes are influenced by interelement loss is proportional to 1/m.

FIG. 8 can be used to compare structures of different element width, d, but same interelement spacings, s=1.5 μm, same interelement loss, and same m. Both structures have favorable far-field radiation patterns with 60–70% of the power in the central lobe. Lower mode loss and a sharper discrimination curve occur when d=7.5 μm. Thus, by increasing d to 7.5 μm, a greater aperture width, which may lead to higher reliable power, is achieved at a cost in reduced discrimination and tolerance in fabrication.

Figure 9:
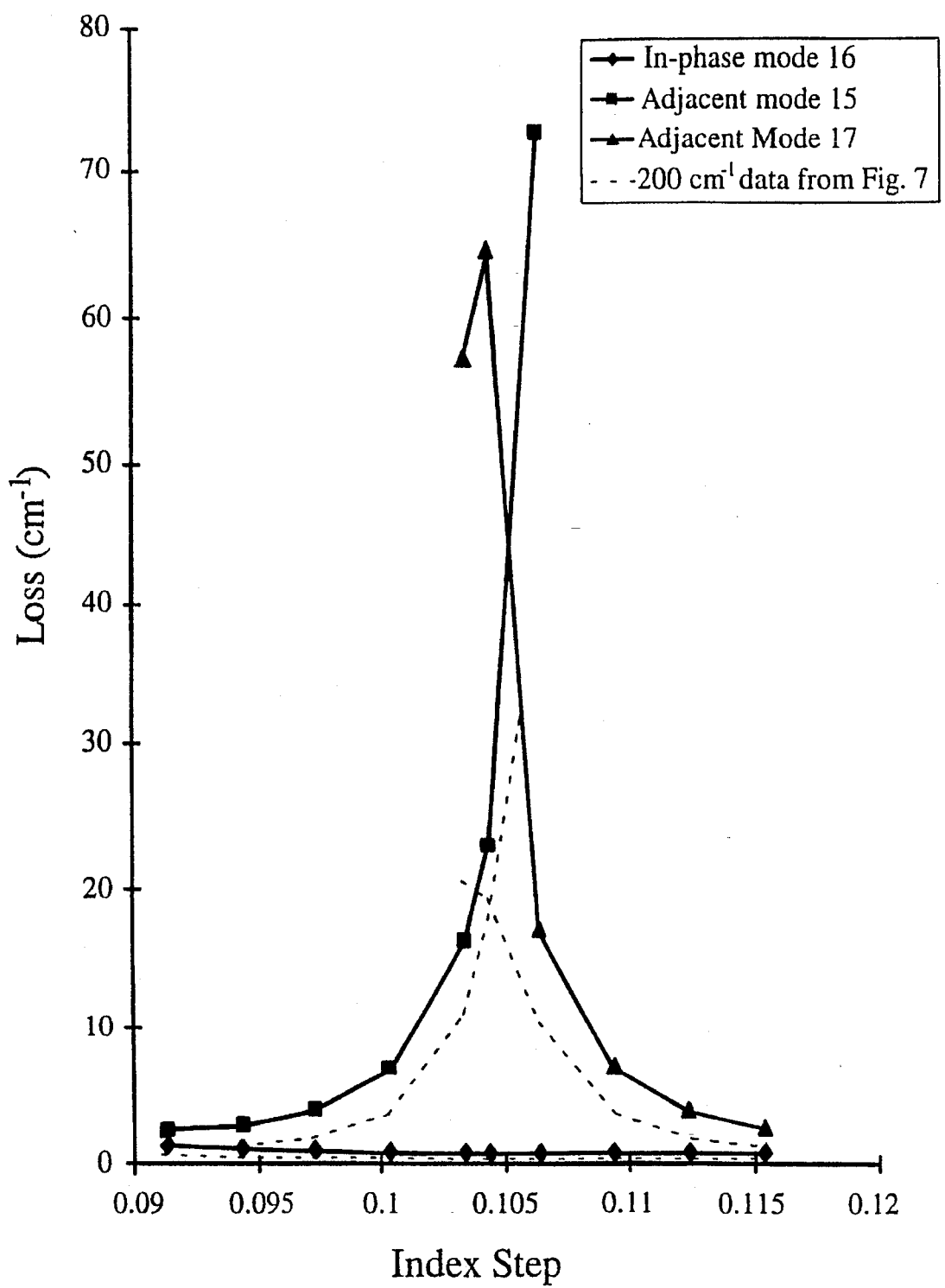
FIG. 9 are graphs showing mode losses versus index step for 3-core ARROW devices with antiguide element width d=7.5 µm, interelement structure width s=1.5 µm, and m=3, with solid curves corresponding to an interelement structure loss of 500 cm$^{-1}$ and dotted curves corresponding to an interelement loss of 200 cm$^{-1}$.
Figure 10:
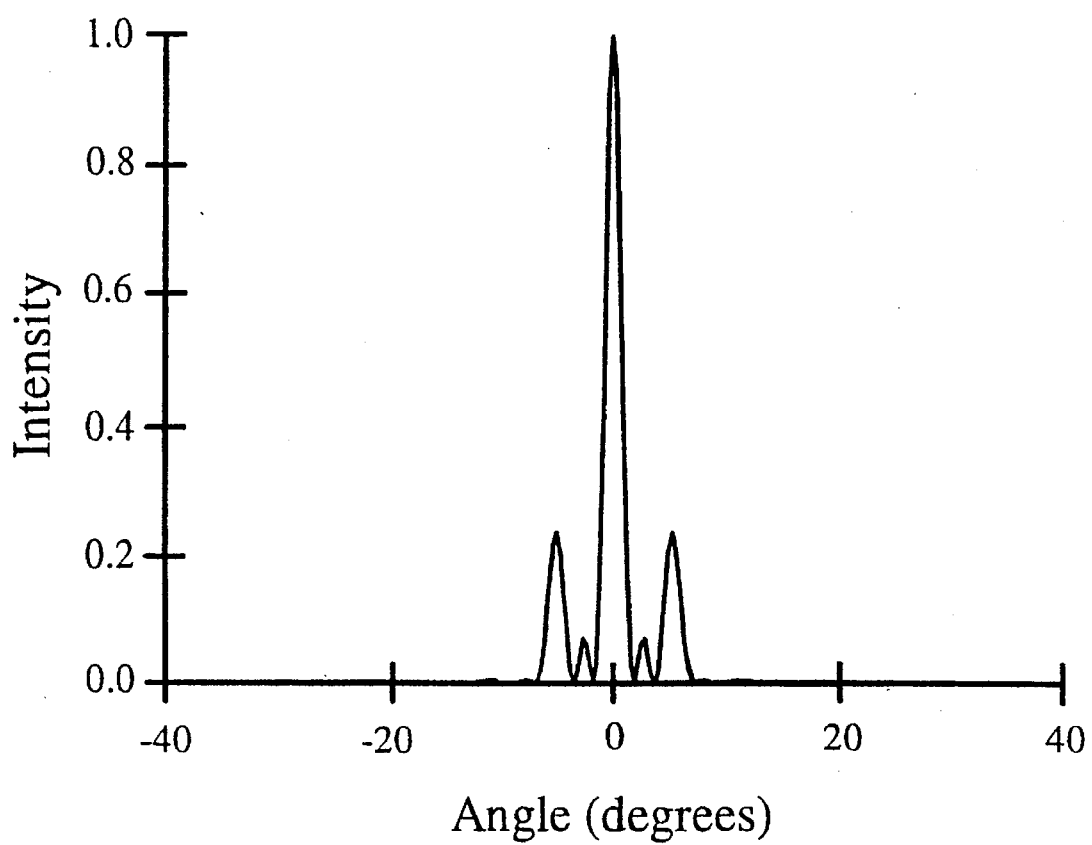
FIG. 10 is a graph showing the far-field beam pattern for a three-core ARROW device with d=7.5 µm, s=1.5 µm, and Δn=0.104; that is, when the in-phase-mode resonance condition is met.

The d=7.5 μm structure of FIG. 8 can be further improved if the interelement loss coefficient is increased. FIG. 9 shows the mode discrimination as a function of Δn for the same d=7.5 μm structure of FIG. 8, except with interelement loss coefficient=500 cm$^{-1}$. For reference, the dotted curve in FIG. 9 indicates the case d=7.5 μm and interelement loss coefficient=200 cm$^{-1}$ from FIG. 8. The loss of the fundamental mode is still very small, because of the tiny fraction of light in the interelement regions for this structure (about 0.1%). When comparing the 7.5/1.5 structures of different interelement loss, it is found that the increase from 200 cm$^{-1}$ to 500 cm$^{-1}$ results in an increase of 50% in the ranges of Δn with significant intermodal discrimination (e.g., 5 cm$^{-1}$, 10 cm$^{-1}$). The maximum intermodal discrimination for d=7.5 μm and interelement loss=500 cm$^{-1}$ is now higher than the case d=4.5 μm, and interelement loss=200 cm$^{-1}$ from FIG. 8, but still with a somewhat reduced fabrication tolerance. It should also be noted that the relatively high interelement loss (i.e., 500 cm$^{-1}$) is not likely to cause self-pulsations due to saturable absorption, since the amount of interelement field is very small—about 0.1%. These structures have a very high index step, yet good intermodal discrimination over a relatively broad range of index-step variation. Thus, they should operate in a stable, fundamental, in-phase mode to very high drive levels. Since the width of the aperture is 25 μm, and since with an aperture of 3 μm for oxide-free-facet devices one obtains reliable operation up to 0.2 W, the device can be expected to operate reliably up to 1.6 W total. The far-field pattern, shown in FIG. 10, has 67% of the power in the central lobe, so that 1 W reliable diffraction-limited power in the central lobe should be available from such devices with oxide-free, nonabsorbing mirror facets.

Figure 11:
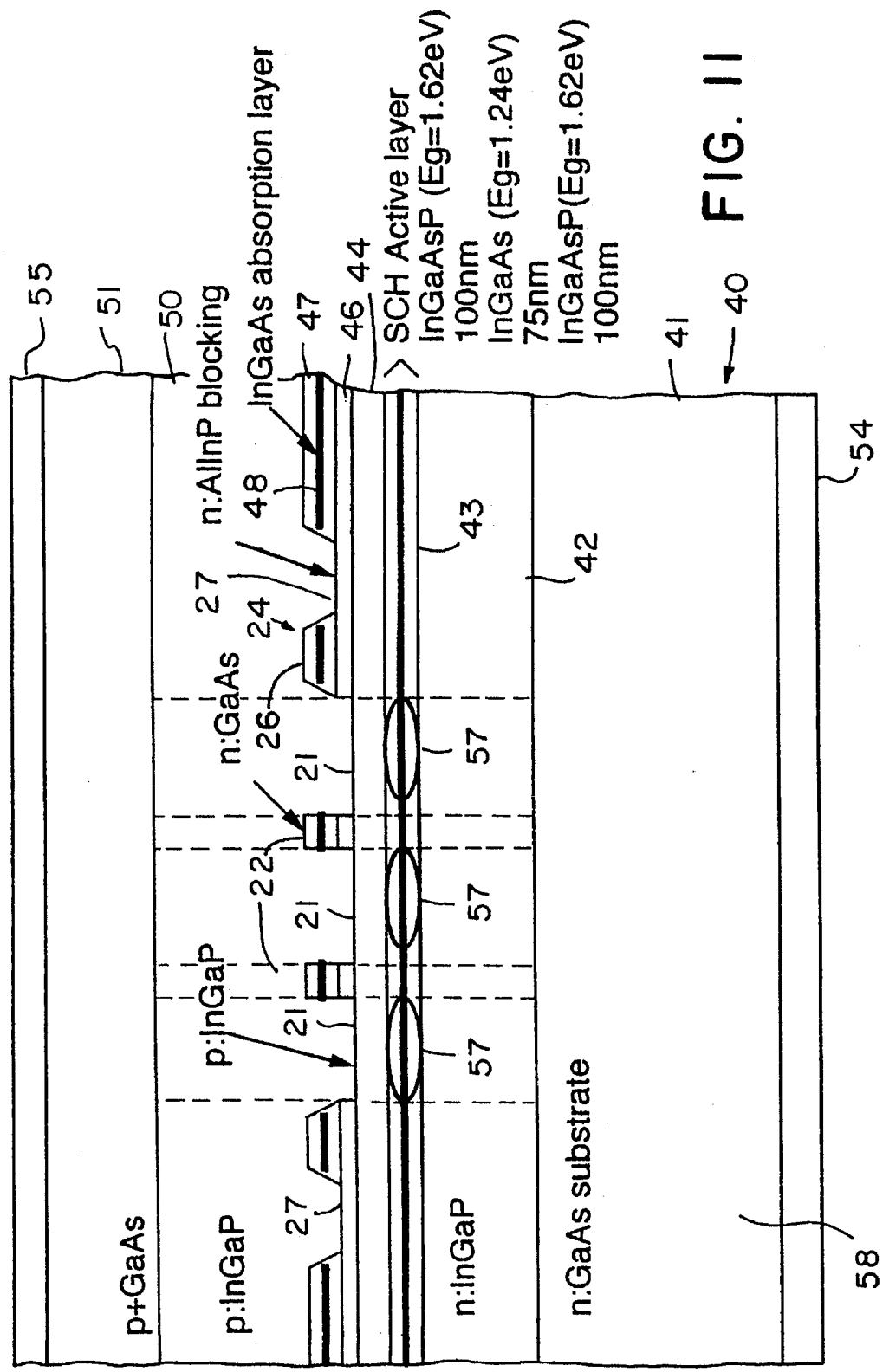
FIG. 11 is a simplified cross-sectional view of a three-core ARROW device in accordance with the present invention using the InGaAs/InGaAsP/InGaP material system.

The realization of a three-core ARROW laser structure with an active layer using a 0.98 μm-emitting InGaAs/InGaAsP/InGaP aluminum-free material system is illustrated in FIG. 11. The semiconductor laser structure 40 of FIG. 11 has a substrate 41 of n type gallium arsenide (GaAs), a cladding layer 42 of n type indium gallium phosphide (InGaP) on the substrate 41, an active light emitting region 43 on the layer 42, a cladding layer 44 of p type InGaP interfaced with the active region 43 opposite the cladding layer 42, a current blocking layer 46 of n type aluminum indium phosphide (AlInP) partially formed over the layer 44, a passive-guide layer 47 of n type GaAs with an intermediate absorption layer 48 of InGaAs formed therein, a cladding layer 50 of p type InGaP over the layer 47 and in contact with the layer 44 (and which may be integral with the layer 44) where the layers 46 and 47 are missing, and a capping layer 51 of p$^+$ type GaAs over the layer 50. Metal contact electrode layers 54 and 55 are formed on the outer faces of the semiconductor structure, in electrical contact with the bottom layer (substrate) 41 and the top capping layer 51, respectively. The active region 43 is formed of a multilayer sandwich of, e.g., 100 nm thick InGaAsP (Eg=1.62 eV), 7.5 nm thick InGaAs (Eg=1.24 eV), and 100 nm thick InGaAsP (Eg=1.62 eV). The antiguide elements 21, the interelement structures 22, and the edge reflectors 24 are labeled in FIG. 11 to correspond to these elements as shown in FIG. 1. The antiguide elements 21 and the interelement structures 22 are generally defined in the semiconductor structure 40 between the dashed lines shown in FIG. 11. The blocking layer is not formed at the positions of the antiguide elements 21, allowing current to flow through these regions as voltage is applied across the metal layer electrodes 54 and 55. Light emission thus occurs primarily at the spaced regions 57 in the active region 43. Reflecting facets at the front and back edges of the semiconductor structure 40 (e.g., the front facet 58 in the plane of the page as shown in FIG. 11) may be formed in a conventional fashion to provide optical feedback for the semiconductor structure and lasing action. Other means for providing optical feedback may be used, such as distributed Bragg reflectors at the ends of the semiconductor structure and distributed feedback gratings within the semiconductor structure.

An aluminum-free material system is desirable because oxides that prevent current flow do not form so readily on the regrowth as when using Al-containing compounds. This particular aluminum-free system is especially desirable because it is essentially oxide-free at the facets, which substantially increases its reliability as compared to AlGaAs-clad uncoated lasers. The only aluminum compound in the structure is the thin AlInP current blocking layer 46, which should have a negligible impact on the catastrophic-optical-damage power limit, since no aluminum is present in the vicinity of the optical mode. In the three antiguided core elements 21, the exposed layer 44 prior to regrowth is aluminum-free (InGaP) to prevent oxidation of the regrowth surface which could block current flow.

Interelement absorption in the interelement structures 21 is obtained by introducing an $In_{0.2}Ga_{0.8}As$ quantum well layer 48 in the middle of the each GaAs guide layer 47. For this structure, 150 Å-thick $In_{0.2}Ga_{0.8}As$ layers 48 have been introduced, which, results in about 200 $cm^{-1}$ optical mode interelement loss. The absorbing layers 48 are strained layers, not lattice matched although lattice matched layers to the GaAs substrate may be used especially for lower wavelengths (e.g., $\lambda \leq$ about 0.87 μm). The absorbing layer 48 may also be formed at the top or bottom of the guide layer 47, or the entire structure 22 may be partially absorbing, and interelement loss may also be obtained by capping the structures 22 with a higher refractive index material to provide radiation loss.

Figure 12:
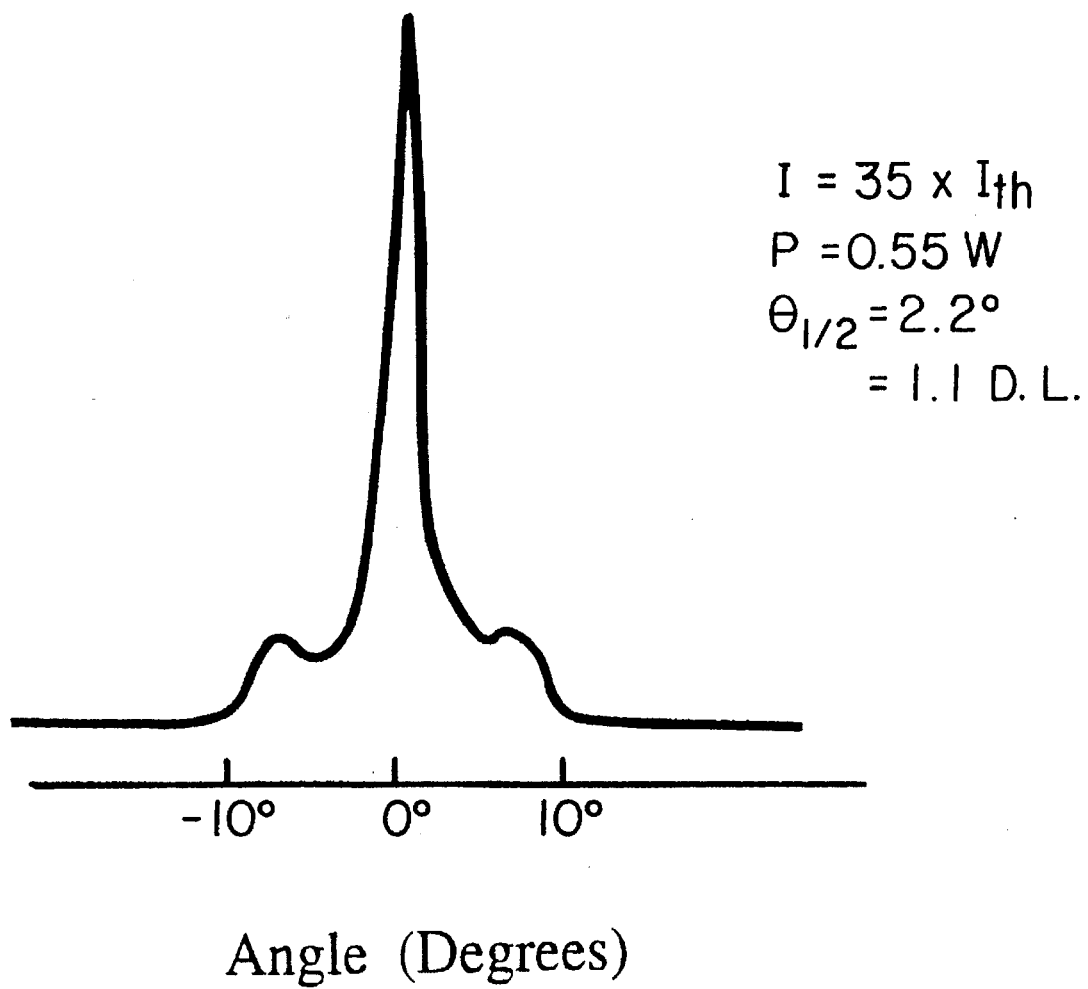
FIG. 12 is a graph showing the far-field beam pattern at 35 times threshold (i.e., 875 mA) for the device of FIG. 11, showing the beam as 1.1 times diffraction—limit and the total peak pulse power (both facets) of 0.55 W.

FIG. 12 illustrates a virtually diffraction-limited far-field beam pattern obtained up to 0.55 W peak pulsed power and 35×threshold current from a three-core ARROW laser fabricated as shown in FIG. 11 (aperture width=19 μm). The specific layer thicknesses for the structure are: 1.5 μm, 0.15 μm, 0.10 μm, 0.2 μm, 1.5 μm, and 0.2 μm for layers 42, 44, 46, 47, 50, and 51, respectively. The doping concentration of the relatively thin n type AlInP blocking layer is $10^{18}$ $cm^{-1}$ (with e.g., silicon dopant). The blocking layer should be of a higher bandgap material than the cladding layer materials. The blocking layer should be oppositely doped to the layer 44, and the same doping type as the substrate. The layer thicknesses within the active region 43 are specified above. As for the lateral dimensions, the antiguide regions 21 are 4.7 μm-wide and the interelement structures 22 are 2.5 μm-wide. It is understood that this material system is illustrative only, and the present invention can be used with any other semiconductor laser diode materials, e.g., GaAs and InP.

Figure 13:
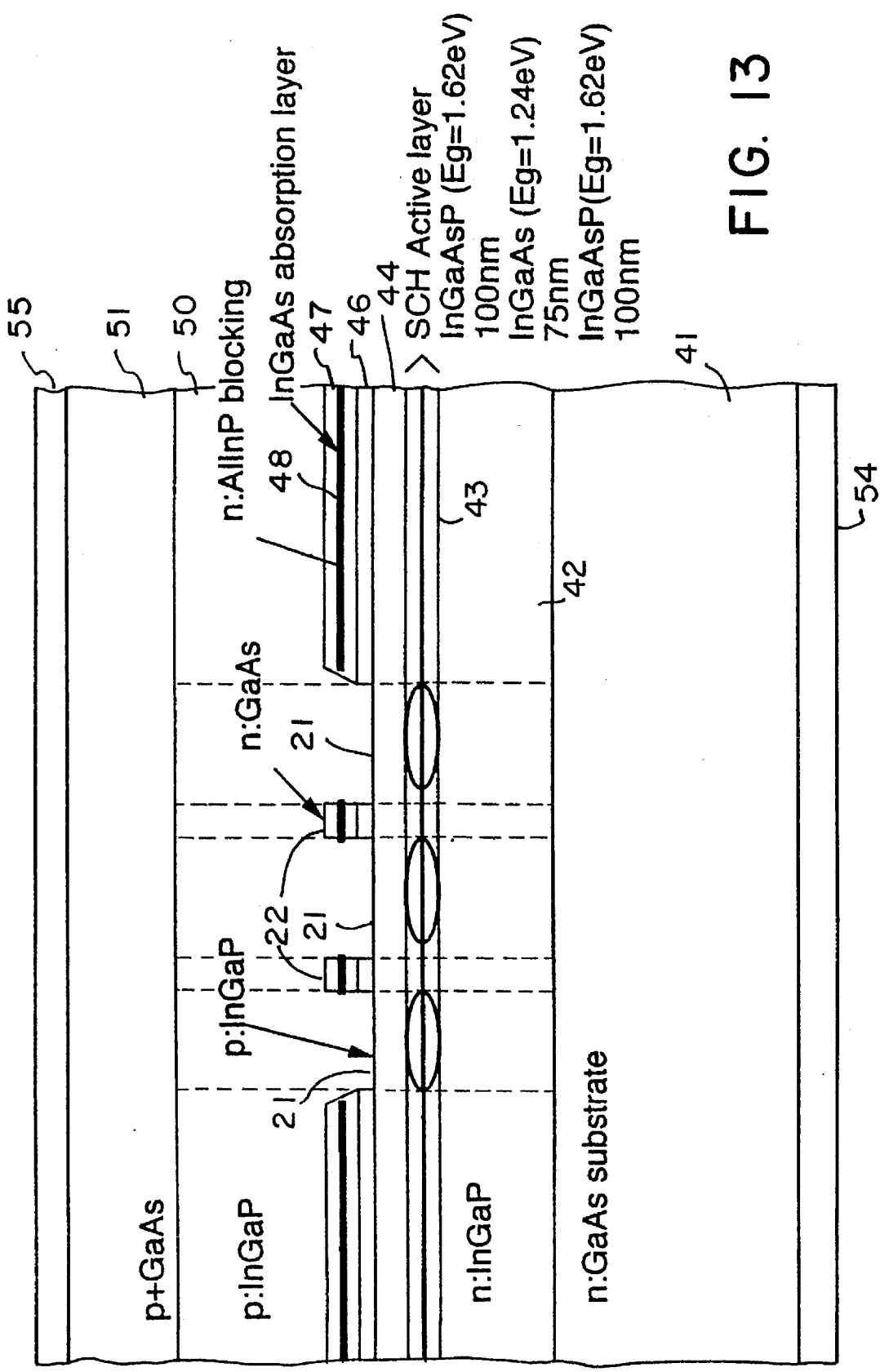
FIG. 13 is a simplified cross-sectional view of a three-core device of the material system of FIG. 11, which does not utilize edge reflectors.

An alternative structure in accordance with the invention is shown in FIG. 13. The structure of FIG. 13 is essentially the same as that of FIG. 11 but with the edge reflector structures 24 eliminated. With the utilization of sufficiently large widths d (preferably greater than 4 μm) for the antiguide elements 21, high index step (greater than about 0.5 and preferably about 0.1 or greater), and high interelement loss (greater than 100 $cm^{-1}$ preferably in the range of 200 $cm^{-1}$ to 500 $cm^{-1}$, and up to 1,000 $cm^{-1}$ or greater), suppression of undesired modes can be obtained without the need for edge reflectors and with little loss in efficiency. As an example, with the parameters chosen as in FIG. 9, including antiguide width d=7.5 μm, index step Δn=0.1, and 0.98 μm wavelength, the edge losses of the fundamental in-phase mode are about 2.6 $cm^{-1}$. In general, in accordance with the present invention, it is possible to chose the optical mode loss coefficient, width of the antiguide elements, and index step to provide fundamental in-phase mode edge radiation losses of 10 $cm^{-1}$ or less, allowing such structures to be utilized without the need for edge reflectors.

Figure 14:
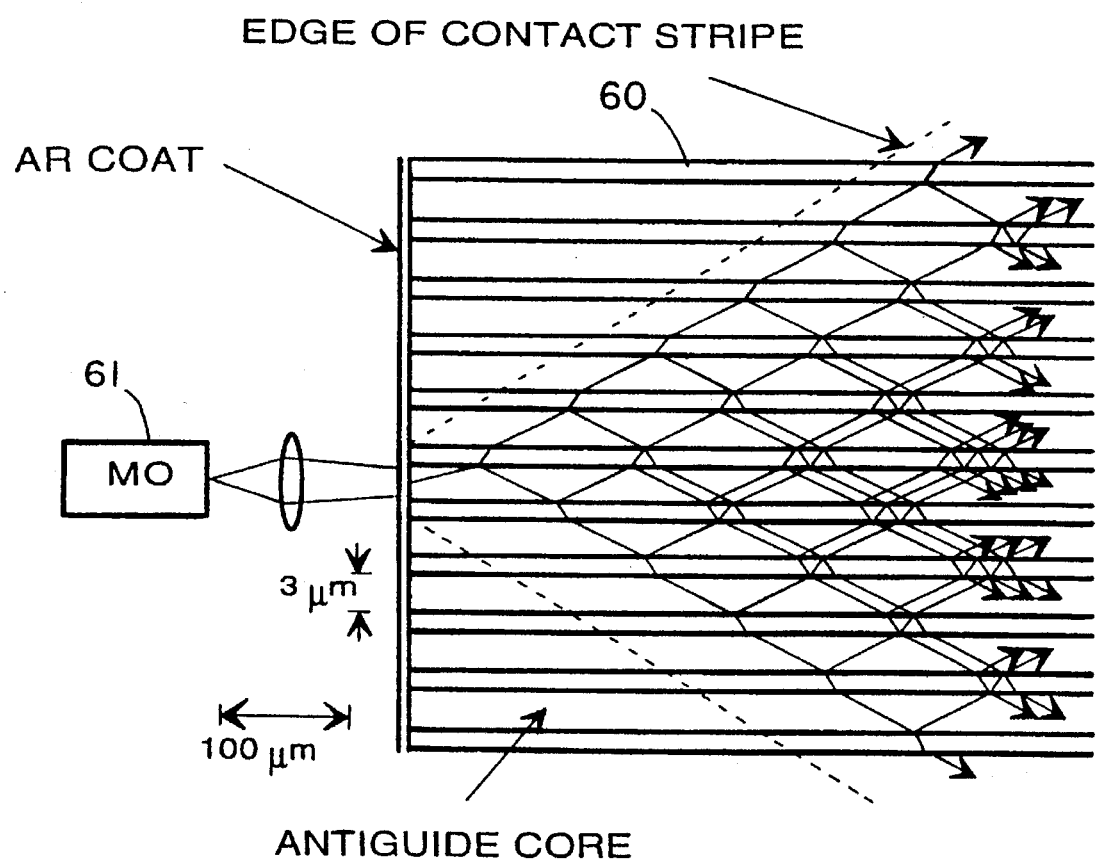
FIG. 14 is a schematic diagram illustrating a flared antiguided master-oscillator power amplifier (MOPA), or ROW-MOPA.

To obtain higher coherent output power, the flared antiguided MOPA has been developed as a solution to the inherent problems of "broad-area" flared MOPAs: i.e., tendency for filamentation and a drive-dependent beam waist position. See D. Botez, M. Jansen, C. Zmudzinski, L. J. Mawst, P. Hayashida, and C. Tu, "Flat-phasefront fanout-type power amplifier employing resonant-optical-waveguide structures," Appl. Phys. Lett., Vol. 63, pp. 3113–3115, December 1993. Instead of relying on diffraction in unguided broad area material, as in flared broad area MOPAs, fanout in these devices occurs via the natural propagation properties of resonant-optical-waveguide (ROW) structures 60 coupled to a master oscillator 61 as illustrated in FIG. 14 and described in U.S. Pat. No. 5,101,413 entitled "Large-Aperture Light Sources Using Resonant Leaky-Wave Coupling". Since ROW structures are structures with a large built-in index variation, ROW-MOPA devices can be much more resistant to the problems that plague the broad area MOPAs. In addition, a flat phasefront is achieved at the output facet, removing the need for an external lens to correct for the curved wavefront that results at the output facet of broad area tapered MOPAs based on diffraction in unguided "free space" semiconductor material.

While flat-phasefront operation has been demonstrated to powers as high as 350 mW (limited by nonoptimized antireflective coatings), the near-field profile is nonuniform when the fanout occurs from injection of light into a single antiguide. By using a three-core ARROW MO 61, field superposition provides a virtually uniform near-field intensity profile at the MOPA emitting aperture. Thus, the antiguided ROW MOPA with a three-core ARROW MO 61 can be more efficient as well as virtually immune to gain spatial hole burning at high power levels.

Figure 15:
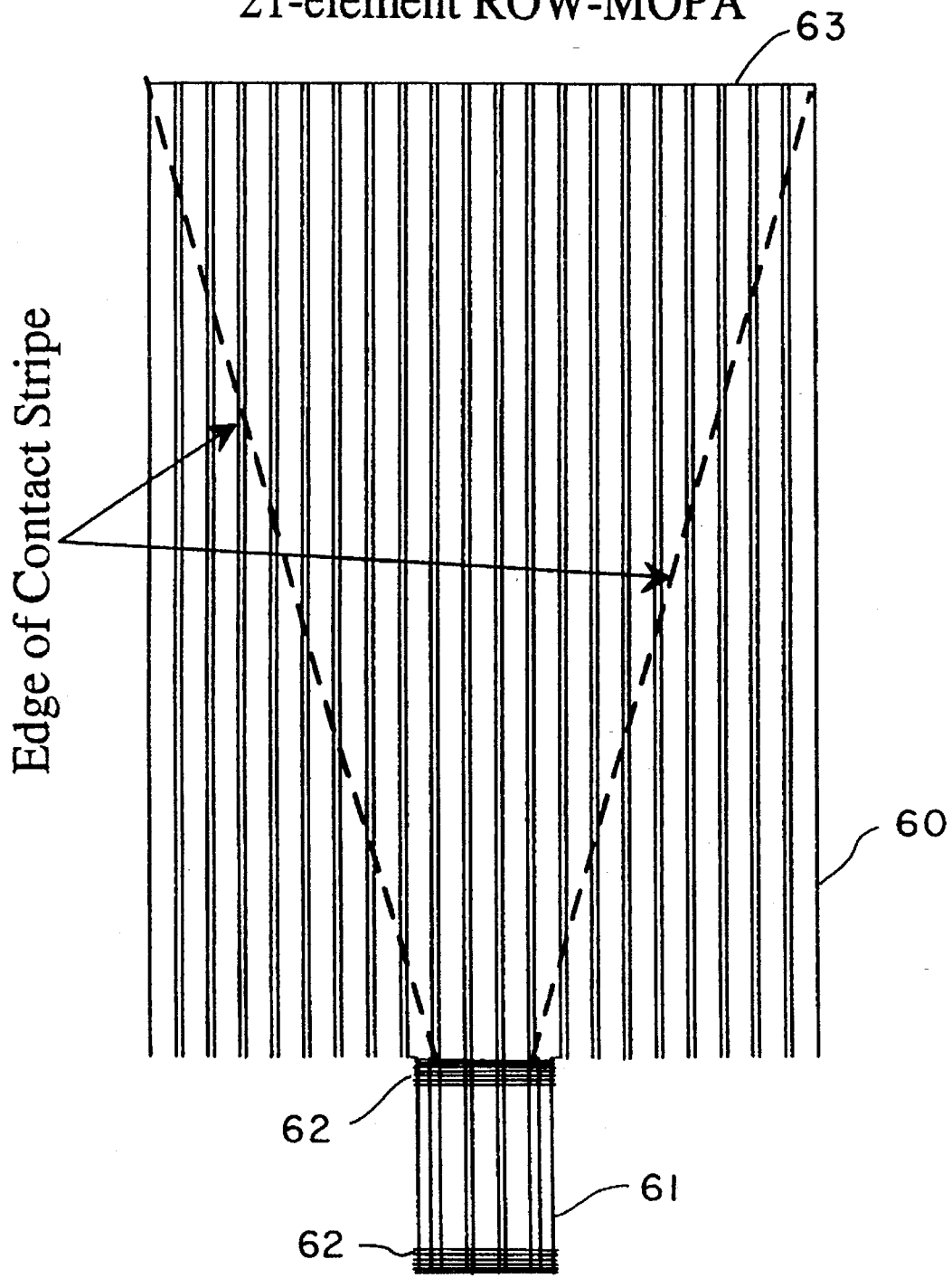
FIG. 15 is a schematic diagram of the monolithic integration of a three-core ARROW device of the present invention as a master oscillator incorporated with an antiguided structure for amplification (PA) to provide a monolithically integrated ROW-MOPA device.

Since both the three-core ARROW master oscillator 61 and the ROW power amplifier 60 are devices based on antiguides, a three-core ARROW MO 61 formed as described above can be integrated with a ROW power amplifier 60, as shown in FIG. 15. The antiguide elements and interelement structures of the power amplifier 60 are aligned with the antiguide elements and interelement structures of the master oscillator 61. To provide optical feedback in the MO 61, distributed Bragg reflector gratings 62 may be formed at the ends of the MO 61. An antireflective coating 63 may be formed at the exit edge of the power amplifier 60 to allow exit of light from the amplifier and prevent feedback. Furthermore, because both the three-core ARROW MO 61 and the ROW power amplifier 60 require approximately the same amount of interelement loss (e.g., ≈200 cm$^{-1}$) for suppressing unwanted modes, the master oscillator and power amplifier integration may be simplified by allowing both to be formed in a single growth cycle. The monolithically integrated ROW-MOPA has emitting apertures ≧200 μm, and thus potential for diffraction-limited powers in excess of 3 W.

It is thus seen that the invention provides a novel high-power (about 1 W) single-mode laser. The device can be designed to have a very large built-in index step, as high as about 0.1, and provides very strong discrimination against unwanted modes by application of an appropriate amount of interelement loss. Thus, it is inherently more stable than broad-area-type coherent devices, and thus immune to filamentation. The fabrication tolerance on index step and device dimensions is greatly relaxed compared to larger element ROW arrays, allowing a high fabrication yield.

Although the invention has been illustrated with respect to a three antiguided core element device, it can be implemented to achieve these advantages with fewer antiguide core elements (i.e., 2) or with additional core elements, up to about 10, before fabrication tolerances again limit satisfactory yields.

It is further understood that the invention is not limited to the embodiments described herein for exemplification, but embraces such forms thereof as come within the scope of the following claims.

What is claimed is:

1. A semiconductor laser comprising:
    (a) a semiconductor structure including a substrate, an active region, cladding layers surrounding the active region, and outer faces, electrodes on the outer faces by which voltage can be applied across the semiconductor structure, and means for providing optical feedback for the semiconductor structure;
    (b) an array of spaced antiguide elements formed in the semiconductor structure and containing the active region where light generation occurs, the number of antiguide elements in the range of 2 to 10, each antiguide element having a selected effective refractive index to the laser light, and interelement structures between the antiguide elements, the interelement structures having a higher effective refractive index than the antiguide elements and formed to provide an optical mode loss coefficient at least about 100 cm$^{-1}$; and
    (c) edge reflectors formed at edges of the array of elements to reflect light back to the array.

2. The semiconductor laser of claim 1 wherein the optical-mode loss coefficient in each interelement structure is at least 200 cm$^{-1}$.

3. The semiconductor laser of claim 1 wherein each interelement structure contains a semiconductor substantially transparent to the wavelength of light emitted from the active region and a layer therein of semiconductor which absorbs the emitted light.

4. The semiconductor laser of claim 3 wherein the layer of absorbing material in each of the interelement structures is formed between layers of the substantially transparent semiconductor in the interelement structures.

5. The semiconductor laser of claim 1 wherein each antiguide element has a width in the range of 5 μm or greater, and the index step in refractive index between the antiguide elements and the interelement structures is at least 0.02.

6. The semiconductor laser of claim 1 wherein the active region is formed of interfaced layers of InGaAs and InGaAsP.

7. The semiconductor laser of claim 6 wherein the substrate is GaAs, one cladding layer is n type doped InGaP semiconductor formed on the substrate, the active region is formed on the n type InGaP layer, and a cladding layer of p type InGaP is formed on the active region.

8. The semiconductor laser of claim 7 wherein the interelement structures are formed to include n type GaAs with an absorption layer therein of InGaAs.

9. The semiconductor laser of claim 1 wherein the number of antiguide elements is 3 to 5.

10. The semiconductor laser of claim 1 wherein there are three antiguide elements.

11. The semiconductor laser of claim 1 wherein the antiguide elements have a width of 7.5 μm and the index step in effective refractive index between the antiguide elements and the interelement structures is about 0.1 or greater.

12. The semiconductor laser of claim 1 wherein the index step in refractive index between the antiguide elements and the interelement structures is at least 0.02, each antiguide element has a width of 5 μm or greater, and wherein the ratio of the width of the antiguide elements to the interelement structures is at least about 5.

13. The semiconductor laser of claim 1 further including a ROW type power amplifier having antiguide elements and interelement structures aligned with the antiguide elements and interelement structures of the semiconductor structure.

14. The semiconductor laser of claim 13 wherein the ROW power amplifier is monolithically integrated with the semiconductor structure.

15. The semiconductor laser of claim 1 including a layer of current blocking material, of higher bandgap than the cladding layers and of the same doping type as the substrate, formed at edges of the array and at the positions of the interelement structures to prevent current from flowing therethrough and to allow current to flow through the antiguide element regions.

16. The semiconductor laser of claim 15 wherein the current blocking layer is formed of AlInP.

17. The semiconductor laser of claim 15 wherein the electrodes are metal layers formed as outermost layers on the top and bottom of the semiconductor structure to allow current to be applied to the metal layers and across the layers of the semiconductor laser.

18. The semiconductor laser of claim 1 wherein the width d of the antiguide elements is selected such that $d≅\lambda_0/2$, where $\lambda_0$ is the laterally projected wavelength of the emitted light in the antiguide elements, and wherein the width s of the interelement structures separating the antiguide elements is $s≅m\lambda_1/2$, where $\lambda_1$ is the laterally projected wavelength in the interelement structures of the emitted light and m is a selected number which determines the number of interelement field-intensity peaks for resonant or near resonant modes.

19. The semiconductor laser of claim 1 wherein the edge reflectors at the edges of the array of elements are each formed of an inner high effective refractive index structure of a width substantially equal to $(2m+1)\lambda_1/4$, where $\lambda_1$ is the laterally projected wavelength in the interelement structures, and an outer lower effective refractive index element of width substantially equal to $\lambda_0/4$, where $\lambda_0$ is the laterally projected wavelength in the antiguided elements.

20. A semiconductor laser comprising:
    (a) a semiconductor structure including a substrate, an active region, cladding layers surrounding the active region, and outer faces, electrodes on the outer faces by which voltage can be applied across the semiconductor structure, and means for providing optical feedback for the semiconductor structure; and (b) an array of spaced antiguide elements formed in the semiconductor structure and containing the active region where light generation occurs, the number of antiguide elements in the range of 2 to 10, each antiguide element having a selected effective refractive index to the laser light, and interelement structures between the antiguide elements, the interelement structures having a higher effective refractive index than the antiguided elements and formed to provide an optical mode loss coefficient of at least about 100 cm$^{-1}$, wherein the antiguide elements have a width of 4 μm or greater, wherein the effective refractive index step between the antiguide elements and the interelement structures is about 0.05 or greater, and wherein the width of the antiguide elements and effective index step are chosen so as to provide fundamental in-phase mode edge radiation losses of less than 10 cm$^{-1}$.

21. The semiconductor laser of claim 20 wherein the optical mode loss coefficient in each interelement structure is at least 200 cm$^{-1}$.

22. The semiconductor laser of claim 20 wherein each interelement structure contains a semiconductor substantially transparent to the wavelength of light emitted from the active region and a layer therein of semiconductor which absorbs the emitted light.

23. The semiconductor laser of claim 22 wherein the layer of absorbing material in each of the interelement structures is formed between layers of the substantially transparent semiconductor in the interelement structures.

24. The semiconductor laser of claim 20 wherein the active region is formed of interfaced layers of InGaAs and InGaAsP.

25. The semiconductor laser of claim 24 wherein the substrate is GaAs, one cladding layer is n type doped InGaP semiconductor formed on the substrate, the active region is formed on the n type InGaP layer, and a cladding layer of p type InGaP is formed on the active region.

26. The semiconductor laser of claim 24 wherein the interelement structures are formed to include n type GaAs with an absorption layer therein of InGaAs.

27. The semiconductor laser of claim 20 wherein the number of antiguide elements is 3 to 5.

28. The semiconductor laser of claim 20 wherein there are three antiguide elements.

29. The semiconductor laser of claim 20 wherein the antiguide elements have a width of 7.5 μm and the index step in effective refractive index between the antiguide element and the interelement structures is at least about 0.1.

30. The semiconductor laser of claim 20 wherein the ratio of the width of the antiguide elements to the interelement structures is at least about 5.

31. The semiconductor laser of claim 20 including a layer of current blocking material, of higher bandgap than the cladding layers and of the same doping type as the substrate, formed at edges of the array and at the positions of the interelement structures to prevent current from flowing therethrough and to allow current to flow through the antiguide element regions.

32. The semiconductor laser of claim 31 wherein the current blocking layer is formed of AlInP.

33. The semiconductor laser of claim 31 electrodes are metal layers on a top and bottom of the semiconductor structure to allow current to be applied to the metal layers and across the layers of the semiconductor laser.

34. The semiconductor laser of claim 20 wherein the width d of the antiguide elements is selected such that d≅$\lambda_0$/2, where $\lambda_0$ is the laterally projected wavelength of the emitted light in the antiguide elements, and wherein the width s of the interelement structures separating the antiguide elements is s≈m$\lambda_1$/2, where $\lambda_1$ is the laterally projected wavelength in the interelement structures of the emitted light and m is a selected number which determines the number of interelement field-intensity peaks for resonant or near resonant modes.

35. The semiconductor laser of claim 20 further including a ROW type power amplifier having antiguide elements and interelement structures aligned with the antiguide elements and interelement structures of the semiconductor structure.

36. The semiconductor laser of claim 35 wherein the ROW power amplifier is monolithically integrated with the semiconductor structure.

37. The semiconductor laser of claim 20 wherein the effective index step is about 0.1 or greater.

* * * * *

UNITED STATES PATENT AND TRADEMARK OFFICE
CERTIFICATE OF CORRECTION

PATENT NO. : 5,606,570
DATED : February 25, 1997
INVENTOR(S) : Botez, et al.

It is certified that error appears in the above-indentified patent and that said Letters Patent is hereby corrected as shown below:

In column 8, line 59 of the patent, delete "(AiInP)" and insert in its place --(AlInP)--

In column 9, line 28 of the patent, delete "it,is" and insert in its place --it is--

In column 9, line 42 of the patent, delete "cm⁻" and insert in its place --$cm^{-1}$--

In column 9, line 59 of the patent, delete "$cm^{-1}$" and insert in its place --$cm^{-3}$--

In column 12, line 66 of the patent, delete "feedback-for" and insert in its place --feedback for--

Signed and Sealed this

Twenty-sixth Day of May, 1998

BRUCE LEHMAN

*Attest:*

*Attesting Officer*  *Commissioner of Patents and Trademarks*